US010825683B2

(12) United States Patent
Doise

(10) Patent No.: US 10,825,683 B2
(45) Date of Patent: Nov. 3, 2020

(54) DIRECTED SELF-ASSEMBLY OF BLOCK COPOLYMERS

(71) Applicants: IMEC VZW, Leuven (BE); Katholieke Universiteit Leuven, KU LEUVEN R&D, Leuven (BE)

(72) Inventor: Jan Doise, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 16/000,145

(22) Filed: Jun. 5, 2018

(65) Prior Publication Data
US 2018/0358223 A1     Dec. 13, 2018

Related U.S. Application Data

(60) Provisional application No. 62/516,335, filed on Jun. 7, 2017.

(51) Int. Cl.
*H01L 21/311*       (2006.01)
*H01L 21/027*       (2006.01)
(Continued)

(52) U.S. Cl.
CPC ...... *H01L 21/0271* (2013.01); *B81C 1/00031* (2013.01); *C30B 25/18* (2013.01);
(Continued)

(58) Field of Classification Search
CPC ......... H01L 21/02118; H01L 21/76838; H01L 21/0274; H01L 21/0337; H01L 21/31144;
(Continued)

(56) References Cited

U.S. PATENT DOCUMENTS 7,521,094 B1 *   4/2009   Cheng ................... B82Y 10/00
                                                   427/385.5
9,911,603 B2 *   3/2018   Cheng ................. H01L 21/0271
(Continued)

OTHER PUBLICATIONS

Bekaert, J. et al., "N7 Logic Via Patterning Using Templated DSA: Implementation Aspects", Proc. of SPIE, vol. 9658, 2015, pp. 965804-1-965804-11.
(Continued)

*Primary Examiner* — Shouxiang Hu
(74) *Attorney, Agent, or Firm* — McDonnell Boehnen Hulbert & Berghoff LLP

(57) ABSTRACT

A method for directing a self-assembly of a block copolymer comprising a first and a second block is provided. The method including: providing a substrate comprising at least one concavity therein, the concavity comprising at least a sidewall and a bottom, the bottom having a preferential wetting affinity for the second block with respect to the first block; grafting a first grafting material onto the sidewall, selectively with respect to the bottom, the first grafting material having a preferential wetting affinity for the first block with respect to the second block; grafting a second grafting material onto the bottom and optionally onto the sidewall, the second grafting material having a preferential wetting affinity towards the first block with respect to the second block; and providing the block copolymer on the substrate, at least within the at least one concavity.

19 Claims, 4 Drawing Sheets

(51) Int. Cl.
| | |
|---|---|
| *H01L 21/02* | (2006.01) |
| *C30B 25/18* | (2006.01) |
| *H01L 21/768* | (2006.01) |
| *B81C 1/00* | (2006.01) |
| *G03F 7/00* | (2006.01) |
| *C30B 29/06* | (2006.01) |
| *H01L 21/033* | (2006.01) |
| *H01L 21/308* | (2006.01) |

(52) U.S. Cl.
CPC ............ *C30B 29/06* (2013.01); *G03F 7/0002* (2013.01); *H01L 21/0274* (2013.01); *H01L 21/02118* (2013.01); *H01L 21/02282* (2013.01); *H01L 21/0337* (2013.01); *H01L 21/0338* (2013.01); *H01L 21/3086* (2013.01); *H01L 21/31144* (2013.01); *H01L 21/76816* (2013.01); *H01L 21/76838* (2013.01); *B81C 2201/0149* (2013.01)

(58) Field of Classification Search
CPC ............ H01L 21/0271; H01L 21/3086; H01L 21/76816; H01L 21/02282; H01L 21/0338
See application file for complete search history.

(56) References Cited

U.S. PATENT DOCUMENTS

| | | | | |
|---|---|---|---|---|
| 2013/0034811 | A1* | 2/2013 | Peeters | B82Y 10/00 430/270.1 |
| 2014/0116980 | A1* | 5/2014 | Wuister | G03F 7/0002 216/11 |
| 2016/0077439 | A1* | 3/2016 | Pimenta Barros | G03F 7/162 216/38 |

OTHER PUBLICATIONS

Chen, Rong et al., "Achieving Area-Selective Atomic Layer Deposition on Patterned Substrates by Selective Surface Modification", Applied Physics Letters, vol. 86, 2005, pp. 191910-1-191910-3.

Gauthier, Marc A. et al., "Synthesis of Functional Polymers by Post-Polymerization Modification", Angew. Chem. Int Ed. 2009, 48, pp. 48-58.

Hawker, Craig J. et al., "The Convergence of Synthetic Organic and Polymer Chemistries", Science, vol. 309, Aug. 19, 2005, pp. 1200-1205.

Nakashima, Hiroshi et al., "Selective Chemisorption of End-Functionalized Conjugated Polymer on Macro-and Nanoscale Surfaces", Langmuir, vol. 21, 2005, pp. 511-515.

Liu, Chi-Chun et al., "Fabrication of Lithographically Defined Chemically Patterned Polymer Brushes and Mats", Macromolecules, vol. 44, 2011, pp. 1876-1885.

Guo, Rui et al., "Perpendicular Orientation of Microdomains in PS-b-PMMA Thin Films on the PS Brushed Substrates", Soft Matter, vol. 7, 2011, pp. 6920-6925.

Seino, Yuriko et al., "Directed Self-Assembly Lithography Using Coordinated Line Epitaxy (COOL) Process", Proc. of SPIE, vol. 9423, 2015, pp. 942316-1-942316-7.

Yi, He et al., "Computational Simulation of Block Copolymer Directed Self-Assembly in Small Topographical Guiding Templates", Proc. of SPIE, vol. 8680, pp. 86801L-1-86801L-7.

Advanced Lithography Technical Program, SPIE. Advanced Lithography, 2017, pp. 1-76.

Doise, Jan et al., "Dual Brush Process for Selective Surface Modification in Graphoepitaxy Directed Self-Assembly", Abstract, https://spie.org/Publications/Proceedings/Paper/10.1117/12.2259791, Mar. 27, 2017, 1 page.

Doise, Jan et al., "Dual Brush Process for Selective Surface Modification in Grapho-Epitaxy Directed Self-Assembly", SPIE Advanced Lithography Paper 10146-26, 2017, 29 pages.

Doise, J. et al., "Implementation of Surface Energy Modification in Graphoepitaxy Directed Self-Assembly for Hole Multiplication", Journal of Vacuum Science & Technology B, vol. 33, No. 6, Nov./Dec. 2015, 10 pages.

Kim, J. et al., The SMARTTM Process for Directed Block Co-Polymer Self-Assembly, Journal of Photopolymer Science and Technology, vol. 26, No. 5, 2013, pp. 573-579.

Matsuo, Y., et al., "Precise Synthesis of Block Polymers Composed of Three or More Blocks by Specially Designed Linking Methodologies in Conjunction with Living Anionic Polymerization System", Polymers, 2013, vol. 5, pp. 1012-1040.

Safety Data Sheet, Polymer Source, Inc., Dec. 14, 2018, Version 7.0, pp. 1-5.

"Representative Block Copolymer Structure of PS-b-PMMA", [Retrieved from the internet Apr. 7, 2020: <URL:https://www.chegg.com/homework-help/questions-and-answers/block-copolymer-self-asse>].

Doise, Jan, et al. "Dual brush process for selective surface modification in graphoepitaxy directed self-assembly." Advances in Patterning Materials and Processes XXXIV, vol. 10146. 2017, 12 pages. Downloaded From: http://proceedings.spiedigitallibrary.org/ on Apr. 3, 2017.

* cited by examiner

DIRECTED SELF-ASSEMBLY OF BLOCK COPOLYMERS

CROSS-REFERENCE

This application claims the benefit of priority from U.S. provisional application No. 62/516,335, filed Jun. 7, 2017 which is incorporated by reference in its entirety.

FIELD OF THE DISCLOSURE

The present disclosure relates to the directed self-assembly of block copolymers and in particular to the modification of surfaces for directing said self-assembly.

BACKGROUND

The patterning of vias and trenches in the manufacturing of integrated circuits is known to be a challenging lithography exercise due to the occurrence of holes with tight pitches in their design, which can in some cases also be irregularly distributed. Although extreme ultraviolet lithography has long been considered the obvious patterning technique to continue scaling the dimensions of such layouts, a delay in its introduction has compelled the industry to move to immersion lithography based multiple patterning techniques to achieve the necessary scaling. However, it is envisioned that with continued scaling these multiple patterning techniques will become increasingly complicated and result in rising costs.

An alternative approach for patterning such layouts can be the use of grapho-epitaxy directed self-assembly (DSA) of block copolymers (BCPs). In grapho-epitaxy DSA, lithography and dry etching are used to create a topographical pre-pattern consisting of trench or cylindrical templates in and sometimes over which a BCP is deposited and allowed to phase separate before one of the blocks is removed. In some applications, this can, for example, result in one or multiple sub-resolution vias within each cylindrical template. In other applications, the same principle can be used to multiply a trench pattern by forming additional lines with a tighter pitch within the trench template.

Consequently, grapho-epitaxy DSA can be regarded as a chemical resolution enhancement technique. The main merit of this method can be the opportunity to extend immersion lithography while reducing the number of needed masks compared to conventional multiple patterning techniques. As a result, the implementation of grapho-epitaxy DSA as patterning technology provides an opportunity to avoid the use of high cost approaches such as extreme ultraviolet lithography and traditional multiple patterning methods.

In Doise et al. (2015) (Doise, Jan, et al. "Implementation of surface energy modification in graphoepitaxy directed self-assembly for hole multiplication." *Journal of Vacuum Science & Technology B, Nanotechnology and Microelectronics: Materials, Processing, Measurement, and Phenomena* 33.6 (2015): 06F301.), a polymer brush with a higher grafting reactivity for the sidewall of a cylindrical hole is used to achieve selective surface modification. By fine-tuning the annealing conditions, a significantly higher brush grafting density on the sidewall compared to the bottom surface of the cylindrical hole was realized. A disadvantage of this approach is that it is not able to generate a very strong affinity for the majority block at the sidewall (i.e. maximal brush grafting density) and at the same time a non-preferential bottom.

There is thus still a need within the art for better methods and structures which alleviate some or all of the above problems.

SUMMARY

It is an object of the present disclosure to provide methods or structures for directing the self-assembly of a block copolymer at least in a concavity.

It is an advantage of embodiments of the present disclosure that a high grafting density at the sidewall of the concavity can be combined with a bottom of the concavity being non-preferential to the block copolymer blocks.

It is another advantage of embodiments of the present disclosure that they can be used as part of a patterning method for patterning vias or trenches. It is a further advantage of embodiments of the present disclosure that these vias or trenches can have a higher resolution than the concavity (i.e. the pre-pattern). It is yet a further advantage of embodiments of the present disclosure that the patterning method has a low cost.

The above objective can be accomplished by a method and device according to the present disclosure.

In a first aspect, the present disclosure relates to a method for directing a self-assembly of a block copolymer comprising a first and a second block, the method comprising:

providing a substrate comprising at least one concavity therein, the concavity comprising at least a sidewall and a bottom, the bottom having a preferential wetting affinity for the second block with respect to the first block;

grafting a first grafting material onto the sidewall, selectively with respect to the bottom, the first grafting material having a preferential wetting affinity for the first block with respect to the second block;

grafting a second grafting material onto the bottom and optionally onto the sidewall, the second grafting material having a preferential wetting affinity towards the first block with respect to the second block; and providing the block copolymer on the substrate, at least within the at least one concavity.

In a second aspect, the intermediate structure for directing a self-assembly of a block copolymer comprising a first and a second block, comprises:

a substrate comprising at least one concavity therein, the concavity comprising at least a sidewall and a bottom, the bottom having a preferential wetting affinity for the second block with respect to the first block;

a first grafting material grafted onto the sidewall, a grafting density of the first grafting material being at least 80%, usually 90% of a maximum achievable grafting density of the first grafting material; and a second grafting material grafted onto the bottom and optionally onto the sidewall, a grafting density of the second grafting material being such that the grafted bottom has no preferential wetting affinity for either block with respect to the other block.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
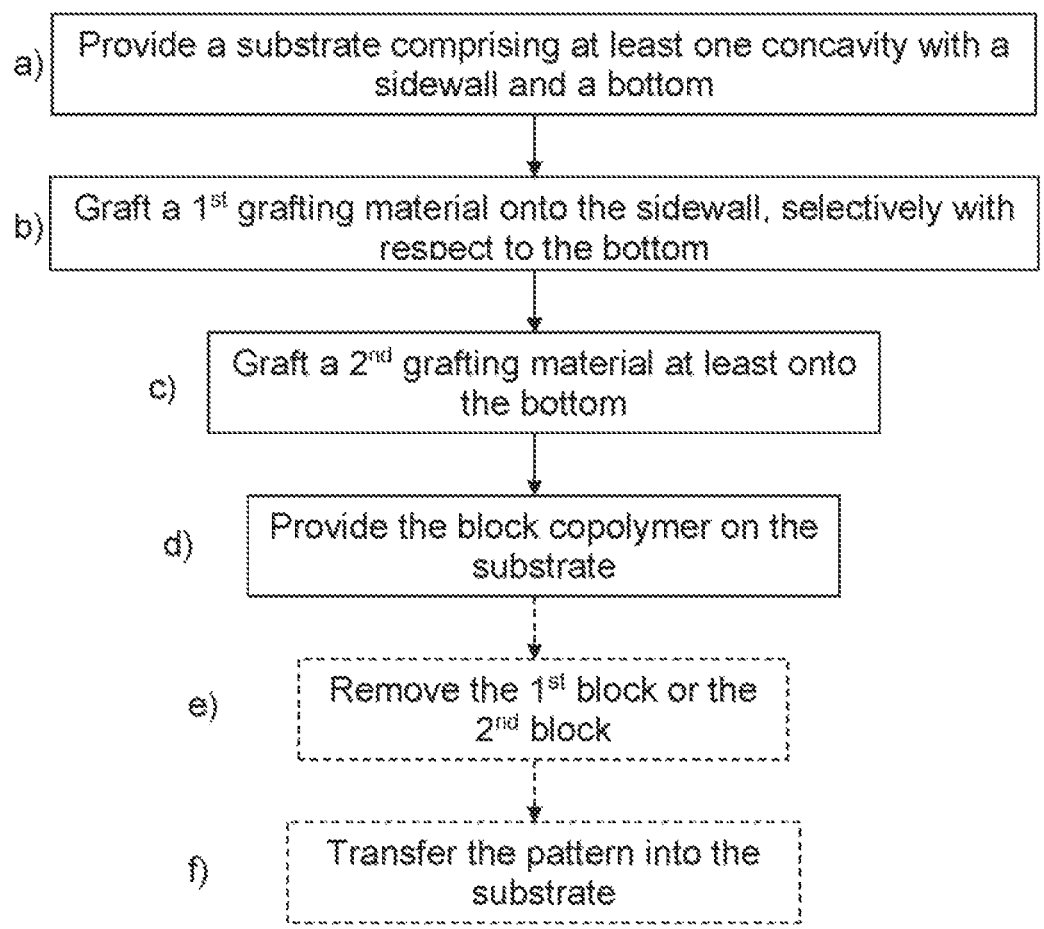
FIG. 1 shows a flow chart in accordance with embodiments of the present disclosure.

In the different figures, the same reference signs refer to the same or analogous elements.]

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms "first," "second" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms "top," "bottom," "over," "under" and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment," "an embodiment," "in some embodiments" or "in other embodiments" means that a particular feature, structure or characteristic described in connection with the embodiment is included in at least one embodiment of the present disclosure. Thus, appearances of the phrases "in one embodiment," "in an embodiment," "in some embodiments," or "in other embodiments" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

The following terms are provided solely to aid in the understanding of the disclosure.

As used herein, the terms "majority block" and "minority block" when referring to blocks of a block copolymer describe blocks that forms a majority of the block copolymer volume and a minority of the block copolymer volume respectively. If the different blocks in the block copolymer have comparable densities, a proxy for determining which block forms a majority of the block copolymer volume may be to determine which block forms a majority of the block copolymer mass, which is typically easily determined from the block copolymer molecular structure. When the block copolymer self-assembles into a cylindrical phase, cylinders of the minority block in a matrix of the majority block are typically formed. When the block copolymer self-assembles into a laminar phase, lamellae of the minority block take less volume than lamellae in the majority block.

In a first aspect, the present disclosure relates to a method for directing a self-assembly of a block copolymer comprising a first and a second block, the method comprising:

providing a substrate comprising at least one concavity therein, the concavity comprising at least a sidewall and a bottom, the bottom having a preferential wetting affinity for the second block with respect to the first block;

grafting a first grafting material onto the sidewall, selectively with respect to the bottom, the first grafting material having a preferential wetting affinity for the first block with respect to the second block;

grafting a second grafting material onto the bottom and optionally onto the sidewall, the second grafting material having a preferential wetting affinity towards the first block with respect to the second block; and providing the block copolymer on the substrate, at least within the at least one concavity.

A flow chart of this method, comprising further optional steps (cf. infra), is depicted in FIG. 1 for one embodiment. Step b) can be performed before step c); step c) can be performed before step b); steps b) and c) can be performed simultaneously. In some embodiments, step b) can be performed before step c) or step c) can be performed before step b). Separating step b) and c) can be advantageous because the grafting times for steps b) and c) may not necessarily be the same and can even be typically different. For instance, a longer annealing time may be desirable for step b) than for step c) as it is the case in the examples described infra. In yet other embodiments, step b) is performed before step c).

In some embodiments, the substrate may comprise a semiconductor substrate. For instance, it may comprise a Si wafer. In some embodiments, the substrate may comprise at least two layers, wherein the at least one concavity penetrates a first layer (e.g. a spin-on-carbon layer) and exposes a second layer (e.g. a $Si_3N_4$ layer). In other embodiments, step a) of providing the substrate comprising the at least one concavity therein may comprise use of an optical lithography, such as an immersion lithography (e.g. 193i immersion lithography).

Step a) may, for example, comprise the substeps of:
a1) providing a substrate;
a2) providing a spin-on-glass (SOG) layer over the substrate;
a3) providing a photoresist layer over the spin-on-glass layer;
a4) patterning a concavity pattern in the photoresist layer using an optical lithography;
a5) transferring (e.g. using a dry etching) the concavity pattern into the substrate; and
a6) optionally removing (e.g. using a 0.5% hydrogen fluoride solution) any remainder of the spin-on-glass or photoresist layer.

In some embodiments, the at least one concavity may be referred to as a pre-pattern.

In some embodiments, the at least one concavity may be at least one hole or at least one trench. The at least one concavity may be one or more cylindrical holes (e.g. holes having a circular cylindrical or oval, such as elliptical, cylindrical shape), or the at least one concavity may be one or more trenches (e.g. trenches comprised in a pattern of fin or line structures).

In some embodiments, the at least one concavity may be one or more cylindrical holes and the block copolymer may self-assemble into a cylindrical phase (cf. infra). In other embodiments, the at least one concavity may be one or more trenches and the block copolymer may self-assemble into a lamellar phase (cf. infra).

In some embodiments, the at least one concavity may have a width ranging from 5 to 200 nm. In other embodiments, the at least one concavity may have a width ranging from 20 to 100 nm. The width corresponds to the smaller lateral dimension of the concavity which in a circular cylindrical hole corresponds to the diameter of the hole and for a trench corresponds to the distance between two fins defining the trench therebetween. In some embodiments, the width may be selected based on a natural periodicity $l_0$ of the block copolymer. In an embodiment, the width may be from $l_0-25\%$ to $l_0+25\%$. For example, for a block copolymer having a natural periodicity $l_0$ of 40 nm, the width may be selected to be from 30 to 50 nm.

In some embodiments, the at least one concavity may have a height ranging from 5 to 300 nm, from 30 to 150 nm, or from 65 to 130 nm.

In some embodiments, the sidewall may comprise a different material than the bottom. In other embodiments, the bottom may comprise $Si_3N_4$ and/or the sidewall may comprise a spin-on-carbon. In some embodiments, the bottom may comprise an inorganic material (e.g. $Si_3N_4$) and the sidewall may comprise an organic material (e.g. a spin-on-carbon). Sidewalls and bottom differing in chemical composition advantageously allows the selective grafting in step b) to be achieved based on a difference in reactivity.

To determine whether the bottom has a preferential wetting affinity for the second block with respect to the first block, a well-established method can be to study the assembly of a lamellar diblock copolymer of the first and second block on this bottom or on a surface mimicking this bottom (see example 2). To determine that the first grafting material has a preferential wetting affinity for the first block with respect to the second block, a well-established method can be to study the assembly of a lamellar diblock copolymer of the first and second block on a surface made of this first grafting material (see example 2).

In some embodiments, step b) of grafting a first grafting material onto the sidewall may comprise:
providing (e.g. spin coating) a solution comprising the first grafting material onto the substrate,
annealing (e.g. thermal annealing under nitrogen atmosphere) the first grafting material, and
removing (e.g. rinsing away with an organic solvent) unreacted first grafting material.

Step b) may optionally comprise also grafting the first grafting material onto a top surface of the substrate, the top surface being coplanar with an opening of the one or more concavities at the top of the substrate. In some embodiments, the sidewall may comprise a different material than the bottom and the first grafting material may comprise a functional group for reacting to the sidewall, selectively with respect to the bottom. In some embodiments, the functional group on the first grafting material may be unreactive toward the bottom and reactive toward the sidewall. In other embodiments, grafting the first grafting material onto the sidewall, selectively with respect to the bottom, may be achieved by a directional deposition technique. In yet other embodiments, a sacrificial material may cover the bottom prior to step b) and grafting the first grafting material onto the sidewall, selectively with respect to the bottom, may be achieved by grafting the first grafting material onto the sidewall, and optionally onto the sacrificial material, and subsequently removing the sacrificial material.

Many functional groups which react with one type of surface but not with another are known in the art. In particular, it is trivial to find reactive groups reacting selectively on organic materials (such as SOC) in presence of inorganic materials (such as $Si_3N_4$). Introducing particular reactive groups on polymer chains is also well known (see for instance Gauthier, M. A., Gibson, M. I. & Klok, H.-A. Synthesis of Functional Polymers by Post-Polymerization Modification. *Angew. Chemie Int. Ed.* 48, 48-58 (2009); and Hawker, C. J. The Convergence of Synthetic Organic and Polymer Chemistries. Science Vol. 309, 1200-1205 (2005), both documents being hereby incorporated by reference). The selection of reactive groups reacting selectively on one inorganic material with respect to another inorganic material is less trivial.

Examples include:
thiolacetate end groups may graft to Au, but not Pt, ITO or $SiO_2$ (Nakashima, Hiroshi, et al. "Selective chemisorption of end-functionalized conjugated polymer on macro- and nanoscale surfaces." *Langmuir* 21.2 (2005): 511-515.);
isocyanide end groups may graft to Au and Pt, but not ITO or $SiO_2$ (Nakashima, Hiroshi, et al. "Selective chemisorption of end-functionalized conjugated polymer on macro- and nanoscale surfaces." *Langmuir* 21.2 (2005): 511-515.); and
octadecyltrichlorosilane (ODTS) may graft selectively to $SiO_2$ with respect to Si (Chen, Rong, et al. "Achieving area-selective atomic layer deposition on patterned substrates by selective surface modification." *Applied Physics Letters* 86.19 (2005): 191910.).

These three articles being hereby incorporated by reference. To determine whether the second grafting material has a preferential wetting affinity for the first block with respect to the second block, a well-established method is to study the assembly of a lamellar diblock copolymer of the first and second block on a surface made of this first grafting material (see example 2).

In some embodiments, step c) of grafting a second grafting material onto the bottom and optionally onto the sidewall may comprise:
providing (e.g. spin coating) a solution comprising the second grafting material onto the substrate,
annealing (e.g. thermal annealing under nitrogen atmosphere) the second grafting material, and
removing (e.g. rinsing away with an organic solvent) unreacted second grafting material.

In some embodiments, step d) of providing the block copolymer may comprise:
providing (e.g. spin coating) a solution comprising the block copolymer onto the substrate, and
annealing (e.g. thermal annealing under nitrogen atmosphere) the block copolymer.

In some embodiments, in step c), the second grafting material may be grafted onto the bottom with a density such that the bottom has no preferential wetting affinity for either block with respect to the other block. Since the bottom (ungrafted, pristine) has a preferential wetting affinity for the second block and since the second grafting material has a preferential wetting affinity towards the first block, an intermediate grafting density of the second grafting material onto the bottom advantageously exists such that the bottom has no preferential wetting affinity for either block with respect to the other block (i.e. a neutral wetting affinity).

In some embodiments, the first grafting material may comprise a polymer and/or the second grafting material may comprise a polymer. In some embodiments, the first grafting material and the second grafting material may both comprise a same polymer (e.g. polystyrene). In some embodiments, the first grafting material and the second material may both comprise a same polymer but having differing reactive end groups.

In some embodiments, the first grafting material and the first block may comprise a same polymer, and/or the second grafting material and the first block may comprise a same polymer. When the first block comprises the same polymer as the first and/or second grafting material, a good wetting behaviour is typically advantageously observed.

In some embodiments, the first block may comprise polystyrene (PS) and/or the second block may comprise poly(methyl methacrylate) (PMMA). A PS-b-PMMA block copolymer is an advantageously commercially available block copolymer, which may self-assemble into a cylindrical or a lamellar phase and of which the self-assembling behaviour is well known.

In one embodiment, the present disclosure may refer to a method for directing a self-assembly of a block copolymer comprising a first and a second block, the method comprising:
a. providing a substrate comprising at least one concavity therein, the concavity comprising at least a sidewall and a bottom, the sidewall and the bottom differing in chemical nature, the bottom having a preferential wetting affinity for the second block with respect to the first block;
b. grafting a first grafting material onto the sidewall, selectively with respect to the bottom, the first grafting material comprising:
a homopolymer of the monomer polymerized in the first block, and
an end-group reactive toward the sidewall and not toward the bottom,
c. grafting a second grafting material onto the bottom and optionally onto the sidewall, the second grafting material comprising a homopolymers of the monomer polymerized in the first block; and d. providing the block copolymer on the substrate, at least within the at least one concavity.

In a first type of embodiments, the block copolymer may self-assemble into a cylindrical phase. In other embodiments, the self-assembled block copolymer may comprise 1 (singlet) or 2 (doublet) cylinders in the concavity. A singlet is typically formed in a circular cylindrical hole, whereas a doublet is typically formed in an oval (e.g. elliptical) cylindrical hole. Self-assembly of a cylindrical phase block copolymer into a cylindrical hole pre-pattern advantageously allows a pattern to be formed having cylinders of smaller dimensions (cylinders of smaller diameters or width resulting in a resolution increase) compared to the pre-pattern.

In some embodiments, the first block may be a majority block and the second block may be a minority block. Since the sidewalls will have a preferential wetting affinity for the first block after step b), this first block advantageously corresponds to the majority block in the cylindrical phase block copolymer. In the case of "majority block"-wetting sidewalls, the concavity dimensions that correspond to best self-assembly are typically half the width of the concavities best in the case of the "minority block"-wetting situation. The first block corresponding to the majority block can thus be advantageous for design considerations, as smaller pre-pattern templates can lead to less design splits.

In a second type of embodiments, the block copolymer may self-assemble into a lamellar phase. In some embodiments, the substrate may comprise a pattern of parallel fin structures and the at least one concavity may be one or more trenches, each trench being defined between a pair of adjacent fin structures. In other embodiments, the method may be for directing the self-assembly of the block copolymer in such a way that lamellae of the first block engulf the fin structures. Self-assembly of a lamellar phase block copolymer in or over a pre-pattern of fin structures advantageously allows a pattern to be formed having a smaller pitch (i.e. a resolution increase) compared to the pre-pattern.

In some embodiments, the method may comprise a further step e) of:

e. removing either of the first block or the second block, selectively with respect to one another.

This further step is indicated as an optional step in FIG. 1. Removing either of the first or the second block advantageously creates a pattern (e.g. a via pattern or a trench pattern) defined by the remaining block of the copolymer. A PMMA block may for example be selectively removed with respect to a PS block by a deep UV exposure and subsequent isopropyl alcohol (IPA) rinse.

In some embodiments, the block copolymer may form a pattern after step e) and the method may comprise a further step f), after step e), of:

f) transferring the pattern into the substrate.

This further step is indicated as an optional step in FIG. 1. The substrate may for example comprise a $Si_3N_4$ layer forming the bottom of the at least one concavity and the pattern may be transferred into the $Si_3N_4$. A pattern, such as a via and/or trench pattern, is for example commonly advantageously used in the formation of a semiconductor device, e.g. in the making of interconnects between transistors in such devices.

In a second aspect, the present disclosure relates to a structure for directing a self-assembly of a block copolymer comprising a first and a second block, comprising:

i. a substrate comprising at least one concavity therein, the concavity comprising at least a sidewall and a bottom, the bottom having a preferential wetting affinity for the second block with respect to the first block;

ii. a first grafting material grafted onto the sidewall; and iii. a second grafting material grafted onto the bottom and optionally onto the sidewall, a grafting density of the second grafting material being such that the grafted bottom has no preferential wetting affinity for either block with respect to the other block.

In one embodiment, the first grafting material has a grafting density being at least 80%, usually 90% of a maximum achievable grafting density of the first grafting material.

As used herein, the bottom having a preferential wetting affinity for the second block refers to the bottom without the second grafting material grafted thereon; as opposed to the grafted bottom, which has no preferential wetting affinity due to the grafting density of the second grafting material thereon.

In some embodiments, the structure may further comprise:

iv. the block copolymer on the substrate, at least within the at least one concavity.

In some embodiments, any feature of the second aspect and its embodiments may independently be as correspondingly described for the first aspect or its embodiments, and vice versa.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

EXAMPLE 1

Surface Modification of a Hole with Two Grafting Materials

Figure 2:
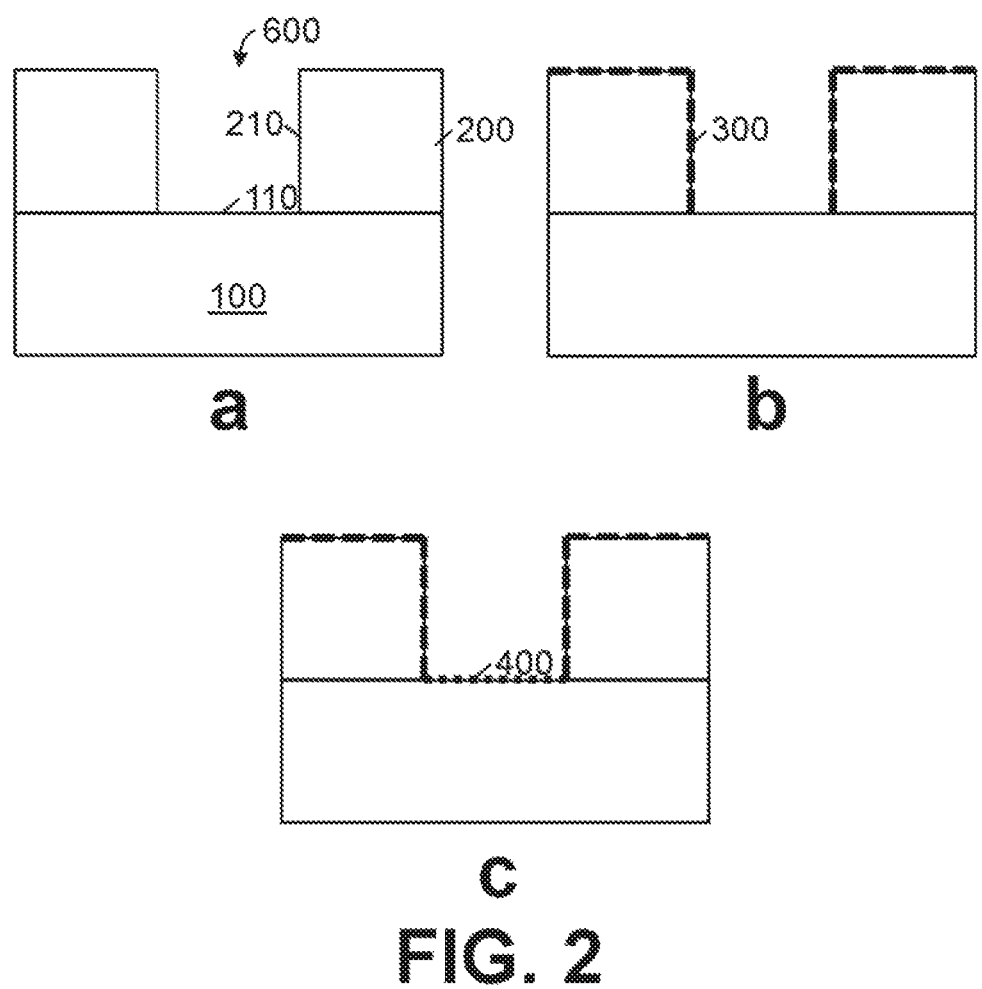
FIG. 2, parts (a) to (c), shows schematic cross-sections of the substrate, depicting several steps in the grafting of the first and second grafting materials, in accordance with the embodiments of the present disclosure.

Referring now to FIG. 2, the grafting of a first and a second grafting material onto the sidewalls (210) and the bottom (110) of a hole (600) is schematically depicted.

Referring now to FIG. 2, part (a), 50 nm of silicon nitride (SiN; 100) was deposited on 300 mm silicon wafers (not shown). A 75 nm thick layer of spin-on-carbon (SOC; 200) HM710, acquired from JSR Micro, was coated on the Si3N4 (100) using a Tokyo Electron CLEAN TRACK LITHIUS Pro Z™. A 30 nm thick layer of spin-on-glass (SOG; not shown) ISX304, again acquired from JSR Micro, and a 85 nm ArF immersion negative tone development photoresist AN02 (not shown), purchased from Fujifilm, were coated on the SOC (200) using a Sokudo DUO coat and development system. For coating and development of the SOC (200), SOG and photoresist, vendor recommended settings were used for post-apply bake, post-exposure bake and development. A hole (i.e. a pre-pattern; 600) was patterned in the photoresist using an ASML NXT:1950i scanner connected to a Sokudo DUO coat and development system. Exposures were done at 1.35 NA using annular illumination with XY-polarization. The templates defined in the resist were transferred into the underlying SOG and SOC (200) by a dry etch process carried out on a Tokyo Electron TACTRAS platform. The remaining SOG was removed using 0.5% hydrogen fluoride (HF) on a Tokyo Electron CELLESTA wafer clean system.

Referring now to FIG. 2, part (b), all brush and BCP processing was done on a on a Tokyo Electron CLEAN TRACK ACT 12™. Both grafting materials used were functionalized polystyrene (PS) brushes with the same polymer backbone but distinct reactive end-groups. However, the first grafting material (300) only reacted significantly with the SOC sidewalls (210). The first PS grafting material (300) was applied by spin-coating from solution, thermal annealing under a nitrogen atmosphere and removing ungrafted polymer molecules by rinsing with an organic solvent RER600, purchased from Fujifilm. By annealing until the maximal grafting density was reached (250° C. for 10 minutes), a strong affinity for PS was achieved on the sidewall (210) without changing the wetting of the bottom (110).

Referring now to FIG. 2, part (c), subsequently, the second PS grafting material (400) was also applied by spin-coating from solution, thermal annealing under a nitrogen atmosphere and removing ungrafted polymer molecules by rinsing with the organic solvent RER600. The second grafting material (400) did react with the Si3N4 (100) and its grafting density was controlled by adjusting the annealing conditions in order to achieve a neutral wetting on the bottom (110) (200° C. for 2 minutes). Any additional grafting of the second grafting material (400) to the SOC sidewalls (210) only further increased the already strong PS-wetting.

EXAMPLE 2

Characterization of the Grafted Sidewalls and Bottom of the Hole

A well-established method (see Doise, Jan, et al. "Dual brush process for selective surface modification in graphoepitaxy directed self-assembly." SPIE Advanced Lithography. International Society for Optics and Photonics, 2017 as well as references 12-14 referenced therein, the disclosure of Doise, Jan, et al. as well as references 12-14 therein being hereby incorporated by reference) to determine for which of the polymer blocks a specific surface has an affinity for, is to analyze the assembly of a lamellar diblock copolymer film on this surface. Generally, preferential wetting of one block at an interface occurs to minimize the free energy of the system, leading to a parallel orientation of the microdomains. In this case, quantization of the film thickness to values of $n \times L_0$ or $(n+½) \times L_0$—for respectively symmetric or antisymmetric wetting cases—occurs to alleviate frustration of the block copolymer domains, where n is an integer and $L_0$ is the bulk lamellar period. This results in a terraced topography (islands or holes) with surface features having heights of $L_0$. On the other hand, in case the surface in question shows non-preferential behavior, this terraced topography is not observed as the lamellar domains orient perpendicularly towards the interface and a flat surface is observed. This method was used to probe the affinity of a modified sidewall or bottom surface by inspecting a lamellar phase PS-b-PMMA (unguided periodicity 28 nm, synthesized by JSR Micro) with initial thickness $1.25 \times L_0$ that was allowed to phase separate on the surface in question.

Under these conditions, antisymmetric wetting corresponds to a surface with affinity for PMMA and results in the formation of holes, since the PS domain segregates to the top surface due to its lower surface energy as compared to that of PMMA. For a surface with affinity for PS (i.e. symmetric wetting), islands are observed.

EXAMPLE 2a

Characterization of the Grafted Bottom of the Hole

To mimic the bottom, 50 nm of $Si_3N_4$ was deposited on blanket 300 mm silicon wafers and a 75 nm thick layer of SOC HM710 was coated on the $Si_3N_4$. A dry etch process was then carried out until about 50 nm of SOC was left. Subsequently, a treatment with 0.5% HF was performed, mimicking an SOG removal step. 4 different samples were then prepared based on this mimicked bottom surface:
  a) a sample as obtained after HF treatment;
  b) a sample whereon, after HF treatment, 0.8 nm of the first PS grafting material was applied;
  c) a sample whereon, after HF treatment, both the first and, subsequently, the second PS grafting materials (annealed until an intermediate grafting density was achieved) were applied, for a combined thickness of 1.9 nm; and
  d) a sample whereon, after HF treatment, 3.8 nm of the second PS grafting material (annealed until a high grafting density was achieved) was applied.

In these samples, the first and second PS grafting material were applied by spin-coating from the respective solution, thermal annealing under a nitrogen atmosphere and removing ungrafted polymer molecules by rinsing with an organic solvent RER600. The processing tools, conditions and materials used, up to and including application of any grafting materials, are identical to the ones employed in example 1. The grafting material thickness ($t_{brush}$) was measured with a KLA-Tencor Aleris spectroscopic ellipsometer using a layered optical model.

A lamellar phase PS-b-PMMA with unguided periodicity 28 nm, synthesized by JSR Micro and used as received, was then spin-coated from solution on each sample a-d and thermally annealed under a nitrogen atmosphere at 180° C.

Figure 3:
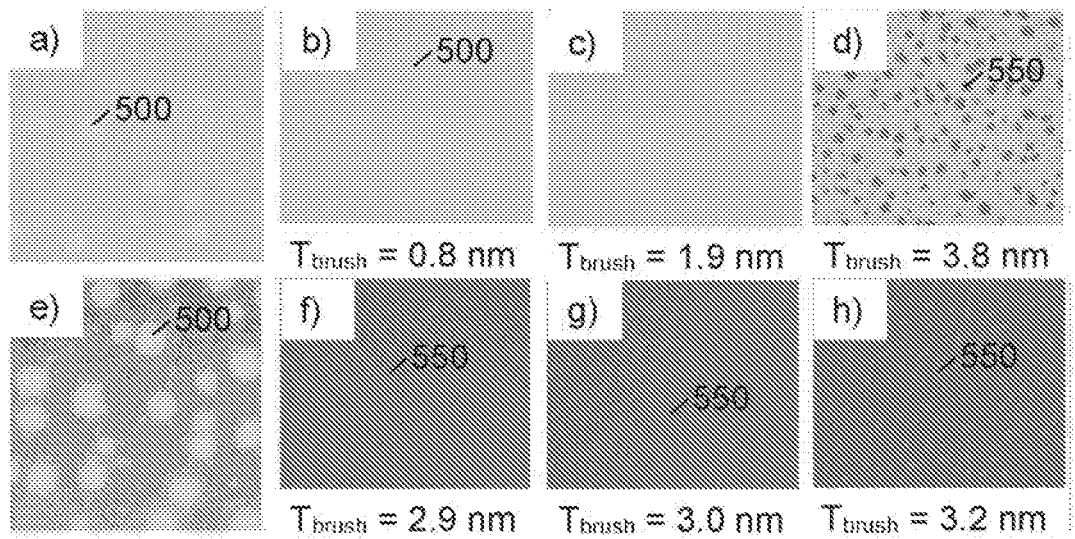
FIG. 3, parts (a) to (h), shows optical micrographs of a lamellar PS-b-PMMA film on surfaces mimicking grafted side walls and bottoms, in accordance with example 2.

FIG. 3, parts (a)-(d) shows optical micrographs of the lamellar PS-b-PMMA film in samples a-d, acquired using a Leica INS 3300 microscope.

As shown in FIG. 3, part (a), for sample a, holes (500) are observed, matching to an affinity for PMMA.

As shown in FIG. 3, part (b), for sample b, holes (500) are again observed, matching with an affinity for PMMA.

As shown in FIG. 3, part (c), for sample c, no topography is seen which is equivalent to a nonpreferential wetting.

As shown in FIG. 3, part (d), for sample d, islands (550) are observed, indicating an affinity for PS.

It should be noted that holes (500) could be distinguished from islands (550) in the optical micrographs by analyzing the perceived color of the features which, due to interference phenomena, depends on the film thickness. The grafting material thickness ($t_{brush}$) measurements were also in agreement with the observed wetting behavior.

EXAMPLE 2b

Characterization of the Grafted Sidewalls of the Hole

To mimic the sidewalls, 50 nm of $Si_3N_4$ was deposited on blanket 300 mm silicon wafers and a 75 nm thick layer of SOC HM710 was coated on the $Si_3N_4$. A dry etch process was then carried out until both the SOG and SOC were removed. Subsequently, a treatment with 0.5% HF was performed, mimicking an SOG removal step. 4 different samples were then prepared based on this mimicked sidewall surface:

e) a sample as obtained after HF treatment;

f) a sample whereon, after HF treatment, 2.9 nm of the first PS grafting material was applied;

g) a sample whereon, after HF treatment, both the first and, subsequently, the second PS grafting materials (annealed until an intermediate grafting density was achieved) were applied, for a combined thickness of 3.0 nm; and h) a sample whereon, after HF treatment, 3.2 nm of the second PS grafting material (annealed until a high grafting density was achieved) was applied.

The lamellar phase PS-b-PMMA with unguided periodicity 28 nm was then spin-coated from solution on each sample e-h and thermally annealed under a nitrogen atmosphere at 180° C.

FIG. 3, parts (e)-(h) show optical micrographs of the lamellar PS-b-PMMA film in samples e-h.

As shown in FIG. 3, part (e), for sample e, holes (500) are observed, matching to an affinity for PMMA.

As shown in FIG. 3, part (f), for sample f, islands (550) are observed, corresponding to an affinity for PS.

As shown in FIG. 3, part (g), for sample g, islands (550) are observed, corresponding to an affinity for PS.

As shown in FIG. 3, part (h), for sample h, islands (550) are observed, indicating an affinity for PS.

The grafting material thickness ($t_{brush}$) measurements were again in agreement with the observed wetting behavior.

EXAMPLE 3

Figure 4:
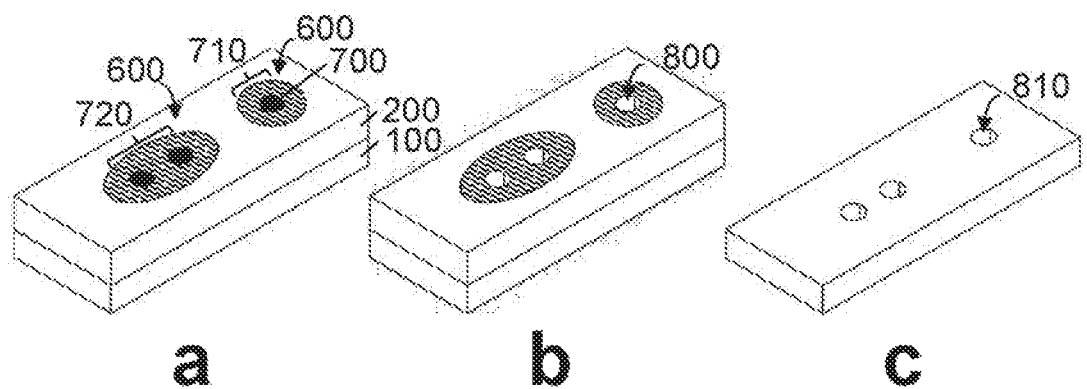
FIG. 4, parts (a) to (c), shows schematic 3D perspectives of several steps in the formation of singlet and doublet vias, in accordance with the embodiments of the present disclosure.

Directed Self-Assembly of a Cylindrical Block Copolymer in a Cylindrical Hole and Subsequent Formation of a Via Pattern Referring now to FIG. 4, part (a), cylindrical phase poly(styrene-block-methyl methacrylate) (PS-b-PMMA) (Mn=66.5 k—28.5 k and unguided center-to-center periodicity 38.1 nm, synthesized by JSR Micro) was spin-coated from solution on a substrate, which was prepared as in example 1, and thermally annealed under a nitrogen atmosphere. Depending on the size and shape (e.g. circular or elliptical) of the holes (i.e. pre-pattern; 600), both singlet (710) and doublet (720) PMMA cylinders (700) were formed.

Referring now to FIG. 4, part (b), the PMMA cylinders (700) were removed by deep ultraviolet (DUV) exposure followed by an isopropyl alcohol (IPA) rinse on a Tokyo Electron CLEAN TRACK LITHIUS Pro Z™, thereby forming a pattern of vias (800). The pattern of vias can be regarded as a tightening of the dimensions (i.e. a resolution increase) compared to the original holes (600).

Referring to FIG. 4, part (c), transfer (910) of the pattern of vias (900) into the underlying Si3N4 (100) was finally carried out on a Tokyo Electron TACTRAS platform.

EXAMPLE 4

Comparison of Process Windows and Pattern Quality

Figure 5:
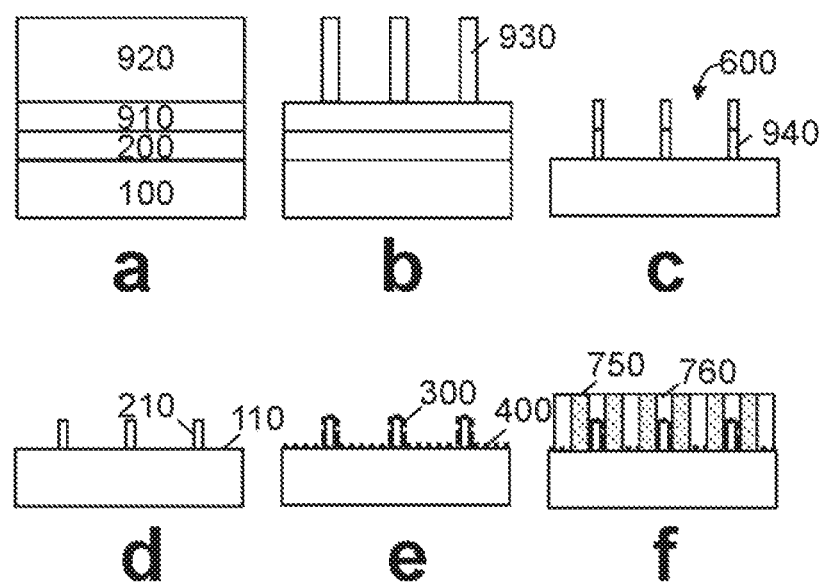
FIG. 5, parts (a) to (f), shows schematic cross-sections of the substrate and further layers thereon, depicting several steps in the self-assembly of a lamellar phase block copolymer over a pattern of fins, in accordance with embodiments of the present disclosure.

The performance of the dual grafting approach in a grapho-epitaxy process flow was compared to two different single grafting instances, one in which only the first grafting material was used (corresponding to a bottom with affinity for PMMA and a sidewall with affinity for PS, see FIG. 3, parts (b) and (f)) and one in which the second grafting material is used and annealed until maximum grafting density is reached (corresponding to bottom and sidewall with an affinity for PS, see FIG. 5, parts (d) and (h)).

Both singlet and doublet process windows were investigated. No major differences were observed in these process windows, other than the dual grafting approach allowing for slightly smaller hole templates in the SOC.

The characteristics of the pattern, after transfer into SiN, were further investigated for different spots in the process window of singlets and doublets. Wafers were examined using a Hitachi CG-5000 top-down critical dimension (CD) scanning electron microscope (SEM). Obtained CD-SEM images (with field of view 675×675 nm) were analyzed using Robust Edge Detection software from Hitachi to determine the CD and centroid position of vias in SiN. To determine the positional error (PE) variability, the measured centroid positions of the patterns of each image were aligned towards the design by allowing translation and rotation of the set of coordinates while minimizing the sum of the squares of the PEs. Afterwards, the PE was calculated as the difference between the measured centroid coordinate after alignment and the design coordinate. Reported values for LCDU and PE are 3σ calculated from 2000 measurements. To determine open via rate for process window examination, SEM images with field of view 1.35×1.35 μm were manually inspected.

It should be noted that by determining the PE by aligning the coordinate set of measured centroids to the design, as done herein, the obtained 3σ values included all stochastic variations coming from lithography, dry etch and DSA processes. This is in contrast to an approach where both template and DSA cylinder centroid are determined from the same SEM image (usually taken after PMMA removal), in which only the variability caused by the DSA process itself would be measured. The disadvantage of the latter approach can be that the image contrast after PMMA removal is quite poor due to the existing topography. Furthermore, the template edge can be altered by the BCP coating, which adds additional variability to the metrology. Finally, doing the inspection after PMMA removal only gives information of the via position at the top of the BCP film, where the concealed three-dimensional morphology may result in a different via placement after pattern transfer.

Characteristics of the pattern in $Si_3N_4$ for singlets are displayed in the table below. For 4 different spots in the process window (S1 to S4), the corresponding critical dimension (CD), local CD uniformity (LCDU), positional error variability (PE) and the number of observed defects per 2000 vias (Def.) are displayed.

|    | Dual grafting | | | | Only first grafting | | | | Only second grafting | | | |
| --- | --- | --- | --- | --- | --- | --- | --- | --- | --- | --- | --- | --- |
|    | CD | LCDU | PE | Def. | CD | LCDU | PE | Def | CD | LCDU | PE | Def |
| S1 | 17.6 | 2.8 | 3.2 | 0 | 17.4 | 3.2 | 3.3 | 0 | 16.2 | 3.9 | 3.3 | 7 |
| S2 | 19.1 | 2.8 | 3.1 | 0 | 19.0 | 3.1 | 3.3 | 0 | 17.7 | 3.2 | 3.3 | 0 |
| S3 | 20.5 | 2.8 | 3.1 | 0 | 20.4 | 3.1 | 3.3 | 0 | 19.0 | 2.3 | 3.2 | 1 |
| S4 | 22.0 | 2.8 | 3.2 | 0 | 22.0 | 3.2 | 3.2 | 0 | 20.5 | 2.6 | 3.2 | 0 |

For these singlets, it can be seen that the dual grafting approach performs the best and most consistent across the process window in terms of PE, LCDU and number of defects.

Characteristics of the pattern in $Si_3N_4$ for doublets are displayed in the table below. For 6 different spots in the process window (D1 to D6), the corresponding CD, LCDU, PE and defects are displayed.

|    | Dual grafting | | | | | Only first grafting | | | | | Only second grafting | | | | |
| --- | --- | --- | --- | --- | --- | --- | --- | --- | --- | --- | --- | --- | --- | --- | --- |
|    | CD | LCDU | PE | C-C | Def | CD | LCDU | PE | C-C | Def | CD | LCDU | PE | C-C | Def |
| D1 | 15.9 | 3.1 | 4.4 | 34.6 | 0 | 15.6 | 3.1 | 4.6 | 34.2 | 0 | 15.2 | 3.9 | 4.2 | 32.9 | 0 |
| D2 | 16.1 | 3.2 | 4.6 | 36.3 | 0 | 16.0 | 3.0 | 4.4 | 36.1 | 0 | 15.4 | 3.6 | 4.2 | 34.3 | 0 |
| D3 | 16.6 | 2.9 | 4.4 | 39.1 | 0 | 16.8 | 3.2 | 4.4 | 38.6 | 0 | 15.7 | 3.1 | 4.3 | 36.6 | 0 |
| D4 | 17.1 | 3.1 | 4.6 | 41.8 | 0 | 17.6 | 3.5 | 4.7 | 40.4 | 0 | 16.2 | 2.7 | 4.6 | 38.6 | 0 |
| D5 | 18.0 | 3.4 | 5.1 | 44.3 | 1 | 18.8 | 3.3 | 4.9 | 43.0 | 0 | 17.2 | 2.7 | 4.4 | 41.7 | 0 |
| D6 | 18.5 | 3.8 | 5.5 | 46.6 | 2 | 19.5 | 3.2 | 5.3 | 44.7 | 0 | 17.8 | 3.2 | 4.9 | 44.0 | 0 |

For these doublets, only a minimal difference between the three grafting approaches in terms of PE was observed. In terms of LCDU, however, the dual grafting material approach performed the best (with an exception for the larger template dimensions where the approach using only the second grafting material showed better results). It should be noted that at these larger dimensions, the BCP is assembling at a center-to-center distance significantly larger than its natural periodicity. This is a regime that may be avoided due to a more unstable assembly.

Altogether, a superior pattern quality was observed for the dual grafting material approach in comparison to single grafting material methods.

EXAMPLE 5

Directed Self-Assembly of a Lamellar Block Copolymer Over a Pattern of Fin Structures, and Subsequent Formation of a Trench Pattern Referring now refer to FIG. 5, part (a), 50 nm of silicon nitride (SiN; 100) is deposited on 300 mm silicon wafers (not shown). A 75 nm thick layer of spin-on-carbon (SOC; 200) HM710 is coated on the $Si_3N_4$ (100) using a Tokyo Electron CLEAN TRACK LITHIUS Pro Z™. A 30 nm thick layer of spin-on-glass (SOG; 910) and an 85 nm ArF immersion negative tone development photoresist (920) are coated on the SOC (200) using a Sokudo DUO coat and development system. For coating and development of the SOC (200), SOG (910) and photoresist (920), vendor recommended settings are used for post-apply bake, post-exposure bake and development.

As shown in FIG. 5, part (b), a pattern (i.e. pre-pattern) of fin structures (930) is formed in the photoresist (920) using an ASML NXT:1950i scanner connected to a Sokudo DUO coat and development system.

As shown in FIG. 5, part (c), the pattern defined in the resist is transferred into the underlying SOG (910) and SOC (200) by a dry etch process carried out on a Tokyo Electron TACTRAS platform. The transferred fin structures (940) define concavities (600) in the form of trenches therebetween.

As shown in FIG. 5, part (d), the remaining SOG (910) is removed using 0.5% hydrogen fluoride (HF) on a Tokyo Electron CELLESTA wafer clean system. This leaves a pattern of SOC fin structures defining trenches therebetween.

Referring now to FIG. 5, (part (e), all brush and BCP processing is done on a Tokyo Electron CLEAN TRACK ACT 12™. Both grafting materials used are functionalized polystyrene (PS) brushes with the same backbone but distinct end-groups. However, the first grafting material (300) only reacts significantly with the SOC sidewalls (210). The first PS grafting material (300) is applied by spin-coating from solution, thermal annealing under a nitrogen atmosphere and removing ungrafted polymer molecules by rinsing with an organic solvent. By annealing until the maximal grafting density is reached, a strong affinity for PS is achieved on the sidewalls (210) without changing the wetting of the bottom (110). Subsequently, the second PS grafting material (400) is also applied by spin-coating from solution, thermal annealing under a nitrogen atmosphere and removing ungrafted polymer molecules by rinsing with an organic solvent. The second grafting material (400) does react with the $Si_3N_4$ (100) and its grafting density is controlled by adjusting the annealing conditions in order to achieve a neutral wetting on the bottom (110). Any additional grafting of the second grafting material (400) to the SOC sidewalls (210) only further increases the already strong PS-wetting.

Referring now to FIG. 5, part (f), a lamellar phase PS-b-PMMA is spin-coated from solution and thermally annealed under a nitrogen atmosphere. Because the SOC sidewalls (210) of the fin structures (940) are preferentially PS-wetting, the block copolymer self-assembles such that the PS blocks engulf the fin structures (940).

Subsequently, not shown in FIG. 5, the PMMA blocks can be removed by DUV exposure followed by an IPA rinse, thereby forming a pattern of trenches. This pattern of trenches may be also be regarded as a pattern of fin structures having a tighter pitch compared to the original pattern of fin structures.

EXAMPLE 6

Comparison of the Trench Pattern Formation According to Embodiments of the Present Disclosure and Techniques Known in the Art Present disclosure (e.g. example 4)

Since grafting of the grafting materials (i.e. brushes) typically occurs after transfer of the pattern of fin structures (i.e. pre-pattern) into the substrate (e.g. SiN) and directly before providing the block copolymer, methods according to present disclosure have several advantages:

Accounting for stack reflectivity during optical lithography is straightforward, as only the SOC and SOG need to be taken into account. There is e.g. no additional complication due to the presence of brush or mat structures or layers at this point.

The brushes are provided by grafting, which overcomes the need for coating uniform layers of a brush (which is typically challenging on most surfaces).

By providing the brushes directly before providing the block copolymer, their surface energy does not get altered by intermediate steps.

The etch contrast between SOG and SOC is such that the obtained sidewall profiles can be very straight. It is furthermore straightforward to create a larger topography of the pre-pattern by increasing the SOC thickness.

LiNe flow (Liu, C.-C.; Han, E.; Onses, M S.; Thode, C. J.; Ji, S.; Gopalan, P; Nealey, P. F. Fabrication of Lithographically Defined Chemically Patterned Polymer Brushes and Mats. Macromolecules 2011, 44 (7), 1876-1885, incorporated by reference in its entirety.)

Integration is difficult as the brush (e.g. X-PS) shows coating issues on most surfaces.

Integration is further complicated because it is difficult to adjust the reflectivity to take the brush into account during optical lithography.

The brush surface energy is altered during trim etch, resist strip and backfill processes, prior to the provision of the block copolymer.

The obtained brush profile shows a large footing, complicating the sidewall profiles of the trench pattern as a whole. When going to thicker brush layers to move to 'hybrid' flows, this footing issue only further increases.

SMART™ flow (Kim, J.; Wan, J.; Miyazaki, S.; Yin, J.; Cao, Y.; Her, Y. J.; Wu, H.; Shan, J.; Kurosawa, K; Lin, G. The SMART™ Process for Directed Block Co Polymer Self-Assembly. J. Photopolym. Sci. Technol. 2013, 26 (5), 573-579, incorporated by reference in its entirety.)

It is difficult to adjust the reflectivity to take the neutral mat (NLD-175) into account during optical lithography.

The surface energy of the neutral mat is altered during etch, resist strip and backfill processes, prior to the provision of the block copolymer.

Because of the similar etch rate between the resist and the neutral mat, the quality of the obtained sidewall profile is diminished.

COOL flow (Seino, Y; Kasahara, Y; Sato, H.; Kobayashi, K; Kubota, H.; Minegishi, S.; Miyagi, K; Kanai, H.; Kodera, K.; Kihara, N.; Kawamonzen, Y; Tobana, T; Shiraishi, M; Nomura, S.; Azuma, T Directed Self-Assembly Lithography Using Coordinated Line Epitaxy (COOL) Process. Proc. SPIE 2015, 9423, 942316, incorporated by reference in its entirety.)

As only a single neutral brush is used for surface energy modification, there is no additional control over the surface energy of the resist guide. This limits the combination of materials (brush and BCP) that can be used in order to successfully guide the self-assembly.

The obtained resist sidewall profiles are tapered.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for directing a self-assembly of a block copolymer comprising a first block and a second block, the method comprising:
   a) providing a substrate comprising at least one concavity therein, the concavity comprising at least a sidewall and a bottom, the bottom having a preferential wetting affinity for the second block with respect to the first block;
   b) grafting a first grafting material onto the sidewall, selectively with respect to the bottom, the first grafting material having a preferential wetting affinity for the first block with respect to the second block;
   c) grafting a second grafting material at least onto the bottom, the second grafting material having preferential wetting affinity towards the first block with respect to the second block, wherein after steps b) and c) are performed, the first grafting material is selectively grafted on to the side wall and the second grafting material is grafting at least onto the bottom; and
   d) subsequent to steps b) and c), providing the block copolymer at least within the at least one concavity substrate, wherein the block copolymer self-assembles within the at least one concavity so that the second block is surrounded by the first block with the least one concavity.

2. The method according to claim 1, wherein the sidewall comprises a different material than the bottom.

3. The method according to claim 2, wherein the bottom comprises $Si_3N_4$ and/or wherein the sidewall comprises a spin-on-carbon.

4. The method according to claim 2, wherein the first grafting material comprises a functional group for reacting to the sidewall, selectively with respect to the bottom.

5. The method according to claim 1, wherein the block copolymer self-assembles into a cylindrical phase.

6. The method according to claim 5, wherein the self-assembled block copolymer comprises one or two cylinders in the concavity.

7. The method according to claim 5, wherein the first block is a majority block and wherein the second block is a minority block.

8. The method according to claim 1, wherein the block copolymer self-assembles into a lamellar phase.

9. The method according to claim 8, wherein the substrate comprises a pattern of parallel fin structures and wherein the at least one concavity is one or more trenches, each trench being defined between a pair of adjacent fin structures.

10. The method according to claim 9, for directing the self-assembly of the block copolymer in such a way that lamellae of the first block engulf the fin structures.

11. The method according to claim 1, wherein the first grafting material comprises a polymer and/or the second grafting material comprises a polymer.

12. The method according to claim 11, wherein the first grafting material and the first block comprise a same polymer, and/or wherein the second grafting material and the first block comprise a same polymer.

13. The method according to claim 1, wherein the first block comprises polystyrene and/or wherein the second block comprises poly(methyl methacrylate).

14. The method according to claim 1, wherein step a) of providing the substrate comprising the at least one concavity therein comprises use of an optical lithography.

15. The method according to claim 1, wherein, in step c), the second grafting material is grafted onto the bottom with a density such that the bottom has no preferential wetting affinity for either block with respect to the other block.

16. The method according to claim 1, comprising a further step e), after step d), of: removing either of the first block or the second block, selectively with respect to one another.

17. The method according to claim 1 wherein step b) is performed before or after step c).

18. The method according to claim 17 wherein step b) is performed before step c).

19. The method according to claim 1, wherein the second grafting material is further grafted onto the sidewall.

* * * * *